(12) United States Patent
Gardner

(10) Patent No.: US 6,599,828 B1
(45) Date of Patent: *Jul. 29, 2003

(54) COPPER REFLOW PROCESS

(75) Inventor: Donald S. Gardner, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/982,575

(22) Filed: Oct. 17, 2001

Related U.S. Application Data

(63) Continuation of application No. 08/175,200, filed on Dec. 28, 1993, now Pat. No. 6,475,903.

(51) Int. Cl.$^7$ .......................................... H01L 21/4763
(52) U.S. Cl. ..................... 438/632; 438/643; 438/646; 438/687
(58) Field of Search .................. 438/632, 660, 438/661, 663, 653, 656, 687, 631, 643, 646

(56) References Cited

U.S. PATENT DOCUMENTS

| | | | |
|---|---|---|---|
| 4,832,788 A | 5/1989 | Nemiroff | 156/643 |
| 4,884,123 A | 11/1989 | Dixit et al. | 357/71 |
| 4,914,046 A | 4/1990 | Tobin et al. | 437/24 |
| 4,920,071 A | 4/1990 | Thomas | 437/188 |
| 4,931,410 A | 6/1990 | Tokunaga et al. | 437/189 |
| 5,032,233 A | 7/1991 | Yu et al. | 204/192.06 |
| 5,043,300 A | 8/1991 | Nulman | 437/200 |
| 5,098,852 A | 3/1992 | Niki et al. | 437/11 |
| 5,124,780 A | 6/1992 | Sandhu et al. | 357/67 |
| 5,198,154 A | 3/1993 | Yokoyama et al. | 252/514 |
| 5,213,638 A | 5/1993 | Mahulikar et al. | 148/627 |
| 5,266,521 A | 11/1993 | Lee et al. | 437/188 |
| 5,654,232 A * | 8/1997 | Gardner | 438/661 |
| 6,207,222 B1 * | 3/2001 | Chen et al. | 427/97 |
| 6,352,926 B1 * | 3/2002 | Ding et al. | 438/687 |

OTHER PUBLICATIONS

Research Disclosure, Feb. 1991.
C.K. Hu et al., "Diffusion Barrier Studies for CU", Jun. 9–10, 1986, V–MIC Conference, IEEE, pp 181–187.
Stanley Wolf et al., "Silicon Processing for the VLSI Era vol. 1: Process Technology", Lattice Press, pp. 161–195.
Stanley Wolf et al., "Silicon Processing for the VLSI Era vol. ll: Process Technology", Lattice Press, pp. 242–244.
Shi–Qing Wang et al., "Filing of Contact and Interconnects with Cu by XeCl Laser Reflow", Jun. 12–13, 1990, VMIC Conference, 1990 IEEE, pp. 431–434.

* cited by examiner

*Primary Examiner*—T. N. Quach
(74) *Attorney, Agent, or Firm*—Blakely, Sokoloff, Taylor & Zafman LLP

(57) ABSTRACT

A manufacturable method for forming a highly reliable electrical interconnection. An electrical interconnection pattern is first formed in a dielectric layer on a semiconductor substrate as recessed regions in the dielectric layer. A conductive layer primarily comprising copper is thereafter deposited over the surface and in the recessed regions of the dielectric layer. The conductive layer is then reflowed to fill the recessed regions of the dielectric layer with substantially no void formation. This reflow process may also be used to improve the step coverage of any such copper layer deposited over the surface of a substrate to be used in conjunction with alternate techniques for forming electrical interconnections including photoresist patterning and etch.

8 Claims, 3 Drawing Sheets

COPPER REFLOW PROCESS

This is a continuation of patent application Ser. No. 08/175,200, filed Dec. 28, 1993, U.S. Pat. No. 6,475,903.

FIELD OF THE INVENTION

The present invention relates to semiconductor processing, and more particularly to a method of forming copper interconnections in a semiconductor device.

BACKGROUND OF THE INVENTION

As the demand for cheaper, faster, lower power consuming microprocessors increases, so must the device packing density of the integrated circuit. Very large scale integration (VLSI) techniques have continually evolved to meet the increasing demand. All aspects of the integrated circuit must be scaled down to fully minimize the device dimensions of the integrated circuit. In addition to minimizing transistor dimensions, one must minimize the dimensions of the electrical interconnections which integrate the semiconductor devices, such as transistors, together on a microchip in order to form a complete circuit.

Currently, aluminum alloys are the most commonly used conductive materials for electrical interconnections in a VLSI integrated circuit. Aluminum and its alloys have been fully characterized for use as electrical interconnections and much technology has been developed to aid in the formation of aluminum interconnections. While aluminum has very attractive features for use as an electrical interconnection, such as low electrical resistivity and strong adhesion to silicon dioxide ($SiO_2$), as VLSI dimensions reach into the deep-submicron Ultra Large Scale Integration (ULSI) regime, the deficiencies of aluminum and its alloys become limiting factors in achieving superior performance. For example, as the width of electrical interconnections becomes narrower, the resistance of aluminum becomes non-negligible and begins to contribute significantly to the resistance-capacitance (RC) time delay of the circuit. Additionally, with decreasing dimensions, design rules become increasingly restricted by aluminum interconnection reliability concerns such as electromigration, stress-induced void formation, hillock suppression, and current density limitations.

For these reasons, the microelectronics industry has recently migrated towards the investigation of more robust, more conductive metals for use in interconnection technology such as Copper (Cu). Cu is approximately 40% lower in resistivity than Al and is much more resistant to reliability problems such as electromigration. One of the main reasons why the use of Cu and its alloys for interconnection applications has not been more widespread is because a manufacturable dry-etch process has not yet been demonstrated that can pattern Cu-based materials using standard photolithographic techniques. To implement the use of Cu as a microelectronic interconnection material, it has therefore become necessary to develop alternate patterning techniques.

One technique is known as damascene. In damascene, a dielectric layer is deposited onto a substrate, patterned, and etched back such that the grooves, vias, or other recessed regions etched into the dielectric layer represent the desired metal interconnection pattern. A conductive material is then deposited over the entire surface of the device, filling in the recessed regions and blanketing the surface of the dielectric layer. Next, the conductive material is etched back to a degree such that the conductive material becomes electrically isolated within the recessed regions etched out of the dielectric layer.

An inadequately filled recessed region in a damascene process flow leads to the creation of a void or tunnel. Voids significantly degrade semiconductor device yields thereby adding to the total manufacturing cost. FIG. 1a shows a semiconductor substrate 105 with dielectric layers 100 and 101 deposited on its surface. A groove 102 has been created in dielectric layer 100. FIG. 1b shows the semiconductor substrate of FIG. 1a after a conductive layer 103 has been deposited on its surface. Note that gap 104 has formed in the conductive layer 103.

As conductive material is deposited onto the substrate of FIG. 1b, the conductive material may be deposited at a faster rate on the top surface and along the walls nearer the top surface of conductive layer 103 then at the bottom of gap 104. The reason for this phenomenon is that as the walls of gap 104 close in, it becomes increasingly more difficult for the conductive material to travel to the bottom of the gap without "touching" and sticking to the walls of gap 104. The amount of conductive material deposited nearer the mouth of gap 104 is determined by how well the conductive material sticks to the substrate upon contact with it. If it sticks easily, as with sputter deposition, then less conductive material will be deposited at the bottom of gap 104 compared to the amount of conductive material deposited nearer the mouth of gap 104 thereby causing a bulging or cusping effect at the mouth of gap 104 as can be seen in FIG. 1b. If the top surface of the substrate is etched back at this point, gap 104 will remain inside groove 102 leading to the problems described below as well as limiting the current carrying capability of the electrical interconnection. Therefore, it is necessary to continue depositing conductive layer 103 in order to better fill groove 102 with conductive material.

FIG. 1c shows the result of continued deposition of a conductive material when the sticking coefficient is high. Note the cusping of the walls at the mouth of gap 104. The result of this cusping is that the bottom of the gap has been pinched-off from the surface of the substrate. Thus, the gap has evolved into a tunnel travelling along groove 102. Such a tunnel is known as a void. Gaps and voids can cause significant problems in a semiconductor manufacturing process and are considerable issues for sputtered and evaporated films. One problem with gaps and voids is that they can trap impurities which can harm the semiconductor device in subsequent process steps. For instance. FIG. 1d shows the semiconductor substrate of FIG. 1c after the surface of conductive layer 103 has been etched back to isolate the portion of conductive layer 103 residing within groove 102 of dielectric layer 100. The isolated conductive layer 103 will become an electrical interconnection of the device. Note that void 104 still exists within the electrical interconnection 103. Even if the void hadn't been created, an open gap would still exist within electrical interconnection 103.

Assuming conductive layer 103 of FIG. 1c was etched back using some sort of chemical etching process, the etchant chemicals may become trapped within the gap or hollow void 104 and cause additional etching or corrosion of electrical interconnection 103 even after the etchant has been removed from the surface of the substrate. These trapped etchant chemicals may then contaminate the semiconductor device which could degrade reliability. Trapped etchant chemicals may also continue to etch the electrical interconnection 103 resulting in the thinning of electrical interconnection 103 or the creation of a electrical open, thereby resulting in a failure. Interconnection thinning may lead to reliability problems such as electromigration and current-carrying limitations. Additionally, trapped contaminants may expand upon subjecting the semiconductor substrate to subsequent high temperature processing steps. Such expansion could cause significant damage to adjoining surface features of the semiconductor device. Finally, trapped contaminants may escape during, for example, a subsequent process step thereby contaminating all other semiconductor devices within the process chamber.

Note that the potential for forming voids is greatly increased by attempting to fill grooves of significantly varying widths together on a single substrate at the same interconnection level using deposition processes with relatively high sticking coefficients. This is because these deposition processes are typically optimized to fill a groove of a particular width. While such optimization techniques may be suitably employed to fill interconnections of this particular width on a semiconductor substrate, the problem is that grooves of widths for which the process has not been optimized run a much higher risk of void formation. This makes interconnection technology dependent on individual device layout. Such dependence degrades the manufacturability of such processes.

It is currently more desirable to form copper interconnections on a semiconductor substrate by Cu sputtering rather than by CVD of Cu. One reason why Cu sputtering is more desirable is that there is a significant cost associated with performing CVD of Cu. Equipment necessary to form CVD Cu layers is currently under development and not yet readily available for high production manufacturing environments. Additionally, the materials necessary to deposit CVD Cu layers are expensive, still under investigation, and the films are not likely to be very pure. Therefore, CVD of Cu is expensive and considerably adds to the total manufacturing cost of a semiconductor device. Also, it is not yet known if certain important alloys of Cu are capable of being deposited using a CVD system. Furthermore, while some CVD techniques which exhibit low sticking coefficients may be capable of minimizing void formation, smooth continuous seams form along the center of the CVD layers within the grooves. These seams may be undesirable due to, for instance, their negative impact on the grain size of the conductive layer and their susceptibility to trapping impurities. Finally, CVD techniques which exhibit low sticking coefficients also exhibit low deposition rates. Therefore, in the interest of manufacturability, higher sticking coefficient CVD processes are typically used to accelerate throughput time. However, these higher sticking coefficient CVD processes exhibit the same short-comings as the high sticking coefficient processes discussed above.

Existing sputter deposition systems can easily and cheaply deposit Cu layers and its alloys. However, sputter deposition systems have exhibited significant limitations in their ability to fill the recessed regions in damascene process flows as discussed above. These limitations have precluded the applicability of sputter deposition systems in a damascene process.

SUMMARY OF THE PRESENT INVENTION

A manufacturable method for forming a high performance, highly reliable electrical interconnection for an advanced semiconductor device is described. First, grooves are formed in a dielectric layer on a semiconductor substrate. After a barrier layer is formed on the surface of the dielectric layer, copper, or an alloy thereof, is then sputtered over the entire surface of the substrate such that open gaps are created in the copper layer caused by the grooves in the underlying dielectric layer. Oxidation of the copper layer is prevented by maintaining a vacuum during the time between sputtering the copper layer and subjecting the copper layer to a subsequent reflow process step. The reflow process consists of exposing the copper layer to elevated temperatures under high vacuum to extra high vacuum conditions. During the reflow process, the grooves of the dielectric layer are substantially filled with copper while gaps, voids, and seams are substantially eliminated. The surface of the copper layer is then chemically-mechanically polished back such that the copper remains only in the grooves of the dielectric layer. These grooves containing the copper then act as a layer of electrical interconnections for the device.

BRIEF DESCRIPTION OF THE DRAWINGS

FIG. 1a is an illustration of a cross-sectional view of a semiconductor substrate after a recessed region has been formed.

FIG. 1b is an illustration of a cross-sectional view of the substrate of FIG. 1a after a conductive layer has been deposited.

FIG. 1c is an illustration of a cross-sectional view of the substrate of FIG. 1b after more conductive material has been deposited.

FIG. 1d is an illustration of a cross-sectional view of the substrate of FIG. 1c after the surface has been etched back.

FIG. 2a is an illustration of a cross-sectional view of a semiconductor substrate.

FIG. 2b is an illustration of a cross-sectional view of the substrate of FIG. 2a after a recessed region has been etched.

FIG. 2c is an illustration of a cross-sectional view of the substrate of FIG. 2b after a conductive layer has been deposited.

FIG. 2d is an illustration of a cross-sectional view of the substrate of FIG. 2c after the conductive layer has been reflowed.

FIG. 2e is an illustration of a cross-sectional view of the substrate of FIG. 2d after the surface has been etched back.

FIG. 3a is an illustration of a cross-sectional view of a semiconductor substrate after a recessed region has been formed.

FIG. 3b is an illustration of a cross-sectional view of the substrate of FIG. 3a after a barrier layer has been deposited.

FIG. 3c is an illustration of a cross-sectional view of the substrate of FIG. 3b after a conductive layer has been deposited.

FIG. 3d is an illustration of a cross-sectional view of the substrate of FIG. 3c after the conductive layer has been reflowed.

FIG. 3e is an illustration of a cross-sectional view of the substrate of FIG. 3d after the surface has been etched back.

DETAILED DESCRIPTION OF THE PRESENT INVENTION

A manufacturable method for forming a highly reliable, electrical interconnection is described which is particularly well suited for advanced VLSI and ULSI applications. In the following description, numerous specific details such as layer thicknesses, process sequences, times, temperatures, etc. are set forth in order to provide a more thorough understanding of the present invention. It will be obvious, however, to one skilled in the art, that the present invention may be practiced without employing these specific details. In other instances, well-known processes and processing techniques have not been described in detail in order not to unnecessarily obscure the present invention.

While diagrams representing a preferred embodiment of the present invention are illustrated in FIGS. 2a–3e, these illustrations are not intended to limit the invention. The specific processes described herein are only meant to help clarify an understanding of the present invention and to illustrate preferred embodiments of how the present invention may be implemented in order to form a preferred device. For the purposes of this discussion, a semiconductor substrate is any substrate comprising any material or materials used in the manufacture of a semiconductor device. A substrate is a structure on which or to which a processing step acts upon.

Figure 2A:
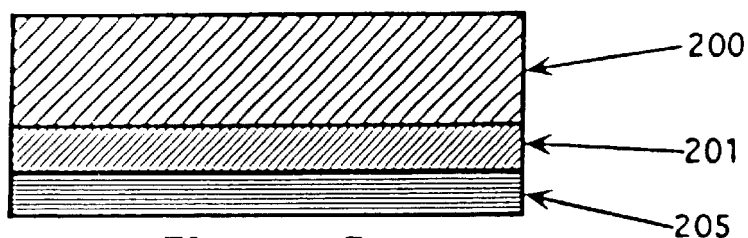
FIGS. 2a–e are illustrative of an embodiment of the present invention where.

In a method consistent with the present invention, layer 205 of FIG. 2a is a semiconductor substrate which may include semiconductor, dielectric, or conductive layers. Semiconductor substrate 205 contains active devices which may be integrated by the process of the present invention. Layer 201 of FIG. 2a is a dielectric layer used to physically and electrically isolate the subsequently deposited conductive layer 203 from the rest of the semiconductor device. Layer 200 of FIG. 2a is another dielectric layer which also serves to physically and electrically isolate the subsequently deposited conductive layer 203 from the rest of the semiconductor device. The electrical interconnection formed by the process of the present invention may serve as, for instance, a metal 1, metal 2, metal 3, or any other interconnection layer in a multilevel interconnection device.

Examining FIG. 2a, dielectric layers 200 and 201 are formed on the substrate 205. Dielectric layers 200 and 201 are typically $SiO_2$ (oxide), but may be silicon nitride (nitride), silicon oxynitride, BSG, PSG, BPSG, silicon carbide, other organic dielectrics such as polyimide, or any other dielectric material which is compatible with a semiconductor manufacturing technology. In an alternate embodiment of the present invention, dielectric layers 200 and 201 may comprise a multilayer stack including dielectric materials and, perhaps, other types of materials which may exhibit semiconductive or even conductive properties. Also, dielectric layer 200 may comprise the same material as dielectric layer 201. In the latter case, dielectric layers 200 and 201 may be formed as a single layer or multilayer stack onto semiconductor substrate 205.

Figure 2B:
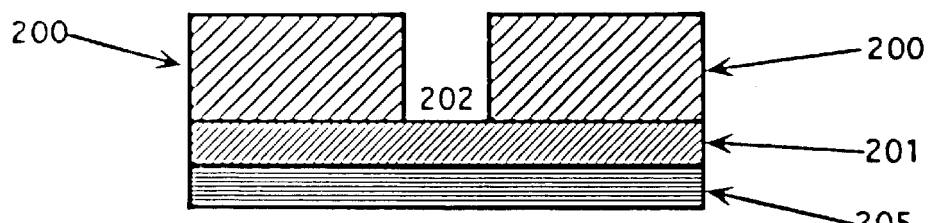

FIG. 2b shows the same region displayed in FIG. 2a after a portion of dielectric layer 200 has been etched to form a recessed region or groove 202 therein. Recessed region 202 may be only a portion of a larger groove (running substantially perpendicular to the page) in order to form a layer of electrical interconnections. Groove 202 may be formed by any one of a plurality of well known etch processes such as RIE, sputter etch, ion milling, or even wet chemical etch. In one method, dielectric layer 201 is used as an etch-stop for the dry etch of layer 200 to form groove 202. In another method where dielectric layer 200 comprises the same material as dielectric layer 201, a timed etch is appropriate. In alternate embodiments of the present invention, FIG. 2b is not formed as a result of etching groove 202 into layer 200 but rather by selectively growing or depositing layer 200 about the groove 202. In an alternate embodiment of the present invention in which a cross-level electrical shunt is to be formed, a recessed region may be isolated to form a vertical via, plug, or contact, and the region is recessed deep enough to make contact with an underlying electrical interconnection layer. Via, plug, contact, electrical interconnection layer, and any other structure with current carrying capacity are herein generically termed electrically conductive layers.

The width of groove 202 may be in the range of approximately 1.5 microns to well within the deep sub-micron regime of 0.25 microns and below. The aspect ratio of groove 202 (depth/width) may be in the range of approximately 0.5 to four. In alternate embodiments of the present invention, grooves of even higher aspect ratios may be formed. Grooves with aspect ratios below 0.5 are generally adequately filled by conventional deposition techniques such as sputtering without the aid of the reflow process described below, however, the reflow process additionally serves to improve the step coverage and general film quality of these wide lines. Since the reflow process does not substantially interfere with these adequately filled wide grooves, the present invention is well suited for simultaneously creating electrical interconnection dimensions of vastly differing widths on a single substrate surface. The depth of groove 202 (and hence the thickness of dielectric layer 200) is approximately 500 nm. However, the depth of groove 202 may be in the range of approximately 200 nm to 3000 nm. Where a recessed region needs to be very deep to accommodate, for instance, a deep vertical via or contact, a recessed region may be approximately 5000 nm. Typically, the walls of groove 202 are substantially vertical to minimize lateral dimensions thereby improving packing density.

Figure 2C:
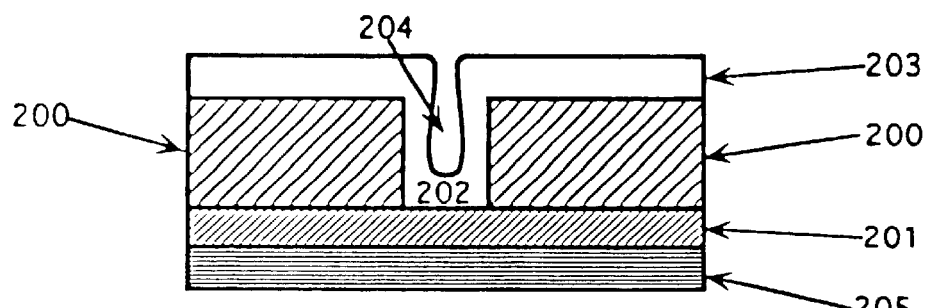

FIG. 2c shows the same region displayed in FIG. 2b after a conductive layer 203 has been deposited. The conductive layer 203 substantially comprises Cu as its primary element and may include alloys thereof such as a vanadium alloy of Cu, a niobium alloy of Cu, or a palladium alloy of Cu. In addition, conductive layer 203 may comprise other materials for use as, for example, barrier layers (barrier layers are described below in more detail). In an embodiment of the present invention in which conductive layer 203 comprises copper with an additive of vanadium, niobium, or palladium, these additives comprise between approximately 0.01 and 2 atomic percent of the conductive material. Cu may be alloyed with any number of dilute quantities of other elements. For example, aluminum may be included in conductive layer 203 to prevent corrosion of the layer. In order to reduce manufacturing costs while improving semiconductor device quality, a preferred embodiment of the present invention uses well known sputter deposition processes to deposit the conductive layer 203. In alternate embodiments of the present invention, CVD, evaporative, or any combination of methods with substrate bias and/or with techniques that ionize the atoms of conductive material may be used to deposit at least a portion of the conductive layer 203.

Figure 2D:
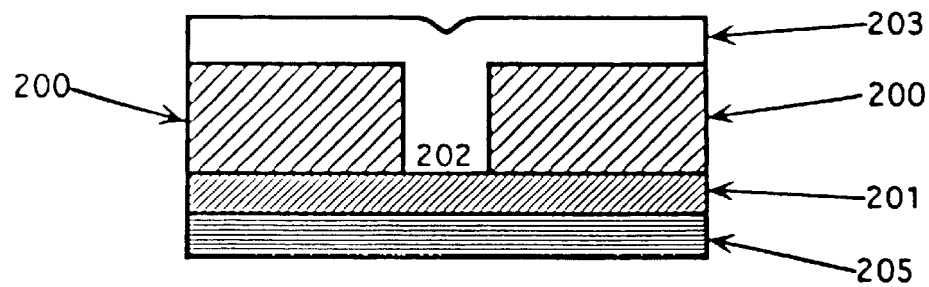

Note gap 204 formed in conductive layer 203. In a preferred embodiment of the present invention, conductive layer 203 is deposited over the entire substrate to a thickness such that gap 204 remains open. For example, in an embodiment in which groove 204 is approximately 500 nm deep, conductive layer 203 may be deposited to a thickness of approximately 1.6 microns without prematurely closing gap 204 and forming a void. As discussed above, deposition to a thickness beyond a certain point will cause the cusps at the upper walls of the gap to meet thereby forming a void at the base of the gap. In accordance with a preferred embodiment of the present invention, gap 204 is completely sealed or filled by a subsequent reflow step which eliminates any gaps, voids, or seams in the conductive layer 203. Note that if a void is actually formed upon deposition of conductive layer 203, the subsequent reflow step may not be able to adequately seal the gap. The result of the reflow step is shown in FIG. 2d.

A reflow step is a process step in which conductive layer 203 is exposed to an elevated temperature under vacuum for a period of time necessary to cause conductive layer 203 to "smooth out" and substantially seamlessly seal gap 204. The elevated temperatures of the reflow step may be obtained by subjecting the substrate to energy sources such as, for example, radiative, furnace, lamp, microwave, or hot gas. For example, in one method consistent with the present invention, a reflow step consisting of approximately 400° C. for 30 minutes under a vacuum of approximately $3 \times 10^{-9}$ torr would achieve the desired result. It has been observed that depositing the conductive layer at low temperatures (below approximately 150° C.) improves the subsequent reflow characteristics of the film. For example, gap 204 is more substantially sealed by a reflow process when conductive layer 203 has been sputtered at a low temperature. By depositing conductive layer 203 at higher temperatures, the reflow time may be reduced due to simultaneous partial reflow and high temperature deposition, however the groove 202 may not be completely filled leading to void formation.

The driving force for the reduction in surface roughness of the conductive layer 63 during the reflow step is believed to be the minimization in surface free energy. This can be viewed at the molecular level as the energy necessary to break the bonds in order to create surface area. The more surface area that is created, the higher the number of bonds that are broken. Therefore, more surface area indicates more surface energy. There are several possible mechanisms that may lead to surface smoothing such as viscous flow, surface diffusion, volume diffusion, and evaporation-condensation or transport through the vapor. Viscous flow is applicable for amorphous materials (e.g. glass), and volume diffusion is important at higher temperatures. For the present invention, it is believed that surface diffusion and some volume diffusion are the two mechanisms by which the reflow step works. It is important to note that surface diffusion and evaporation-condensation would be impeded by the formation of an oxide layer, so reflow should preferably be done in a vacuum or pure inert atmosphere.

For this reason, a preferred embodiment of the present invention maintains conductive layer 203 under very high to extra high vacuum conditions between and during the deposition of at least a portion of conductive layer 203 and the subsequent reflow process step. In alternate embodiments of the present invention, conductive layer 203 is kept under an inert atmosphere during the critical time period between the deposition of conductive layer 203 and the reflow step. Still alternate embodiments of the present invention keep conductive layer 203 under at least high vacuum conditions, perhaps in addition to maintaining an inert ambient, during this critical time period. To improve the manufacturability of the present invention, the deposition and reflow process steps may be performed within the same vacuum system without significantly breaking the vacuum. Generally, high vacuum is considered to be a pressure between approximately $1 \times 10^{-3}$ torr and $1 \times 10^{-6}$ torr, very high vacuum between approximately $1 \times 10^{-6}$ torr and $1 \times 10^{-9}$ torr, ultra high vacuum between approximately $1 \times 10^{-9}$ torr and $1 \times 10^{-12}$ torr, and extra high vacuum between approximately $1 \times 10^{-12}$ torr and $1 \times 10^{-15}$ torr. An inert atmosphere for copper may include nitrogen or any of the noble gases such as argon. In this manner, the potential for the formation of an oxide layer on the surface of the conductive layer 63, which may inhibit the reflow process, is significantly reduced or eliminated.

In a preferred embodiment of the reflow process step, conductive layer 63 is exposed to a temperature below approximately 500° C. However, the conductive layer 63 may be exposed to temperatures in the range of approximately 200° C.–800° C. with the range of approximately 300° C.–650° C. being preferred. Various temperature ramping schemes may be utilized in order to better control the reflow process to promote complete sealing of the gap. Note that reflowing too quickly may cause void formation. In general, the upper limit on the temperature to which the conductive layer may be exposed depends on the underlying substrate materials. For example, if an aluminum layer is included in the underlying substrate, the reflow temperature should be kept below the minimum temperature at which the aluminum layer melts (660° C.), its barrier layer is consumed, junction spiking occurs, damaging hillocks are formed, or any other damage to the device or severe degradation in its reliability can result. It is also important to keep reflow temperatures low so that, for example, any previously deposited oxide layers don't themselves reflow. Because it may be necessary to keep the reflow temperature low, it is fortunate, and indeed surprising, that copper may be reflowed at temperatures below approximately 673° Kelvin (estimated actual surface temperature), less than half of copper's melting point of 1356° Kelvin. Note that all temperatures offered herein in conjunction with the reflow process, unless otherwise noted, are based on thermocouple measurements and do not necessarily reflect actual substrate surface temperatures.

Figure 1A:
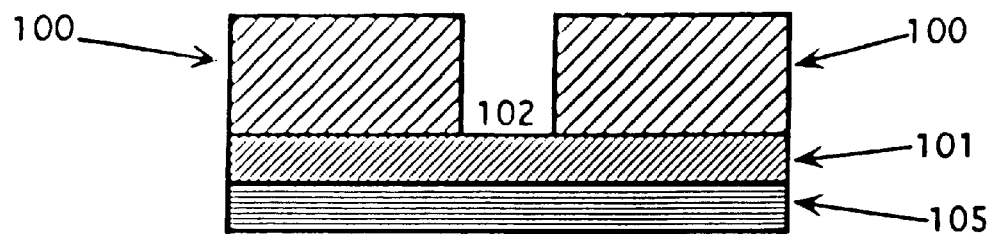
FIGS. 1a–d are illustrative of the prior art techniques where.
Figure 1B:
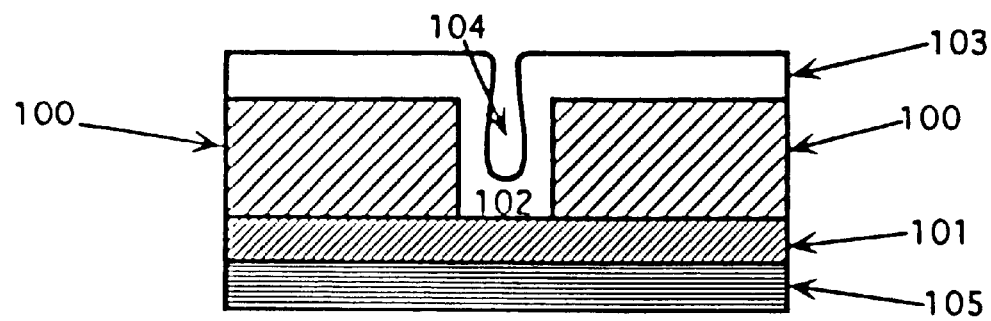
Figure 1C:
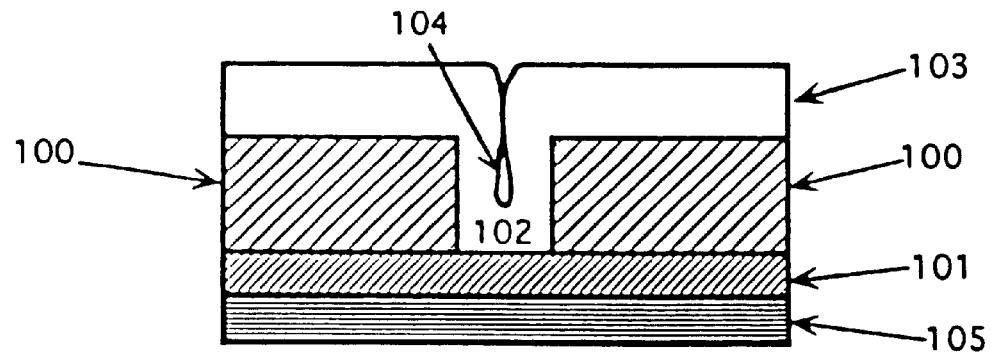
Figure 1D:
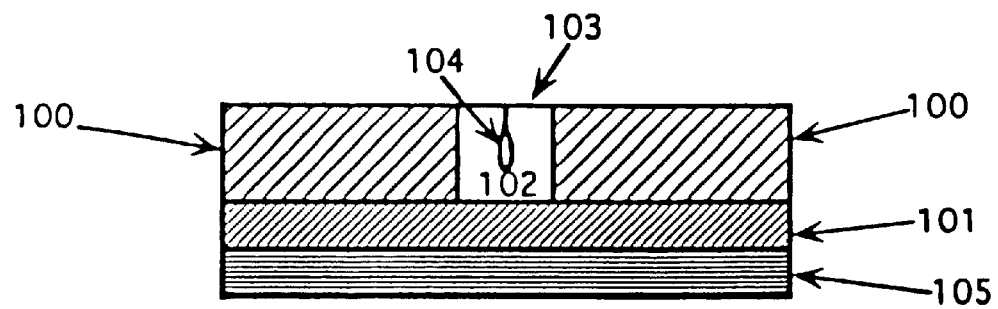

FIG. 2d illustrates the cross section of FIG. 2c after the reflow step has been performed. Note how the reflow step has completely sealed gap 204 of FIG. 2c. Contrasting this with gap 104 of FIG. 1b or the void of FIG. 1c, an advantage of the present invention over the prior art can be seen. The groove 202 has been more completely filled by conductive layer 203 during the reflow step than groove 202 would have been filled by continued deposition of a thicker conductive layer 203. Since the gap 204 of FIG. 2c has been virtually eliminated, the problems associated with gaps, voids, and seams, some of which have been discussed above, have also been eliminated. The conductive layer 203 may now be etched back to confine the conductive layer 203 to groove 202.

Figure 2E:
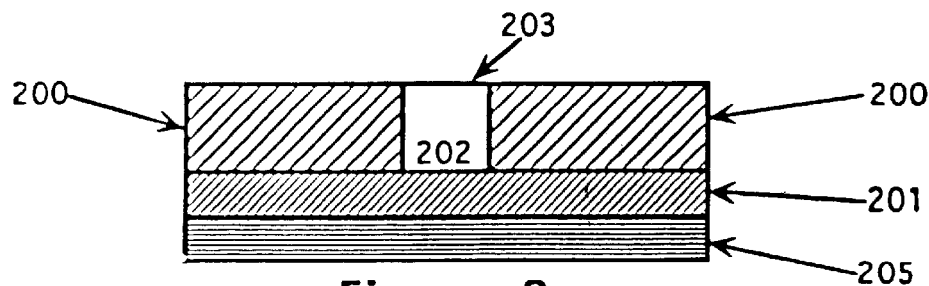

FIG. 2e shows the cross section of FIG. 2d after the completion of an etch back process step. In a preferred embodiment of the present invention, well known chemical-mechanical polishing processes can be used to etch the conductive layer 203 from the upper surfaces of dielectric layer 200. Thus, the portion of the conductive layer 203 which exists substantially outside the groove 202 is removed thereby isolating conductive layer 203 to the groove 202. In a preferred embodiment of the present invention, an upper portion of dielectric layer 200 is also removed as part of an over-etch process to be sure most of the conductive layer 203 which resides substantially outside the groove 202 has been removed. In an alternate embodiment of the present invention, an alternate etch process such as wet chemical etch, RIE, back sputter, ion mill, or mechanical polishing can be used to remove the portion of the conductive layer 203 which resides substantially outside the groove 202. Note that etching techniques such as polishing additionally serve to planarize the surface of the substrate.

Figure 3A:
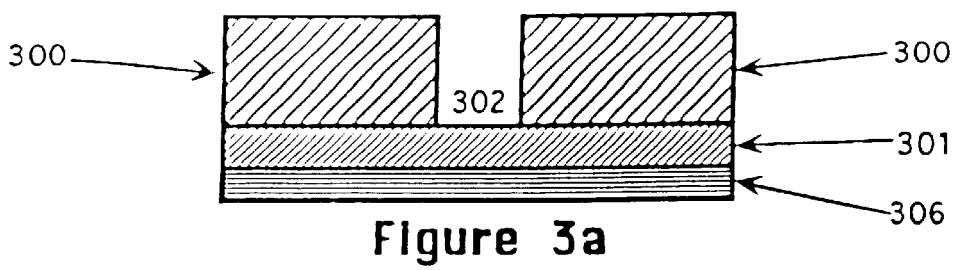
FIGS. 3a–e serve to further illustrate an embodiment of the present invention where.

FIGS. 3a–3e illustrate a more detailed description of a preferred embodiment of the present invention already shown in FIGS. 2a–2e in which a barrier layer is specifically illustrated as part of the conductive layer. FIG. 3a is analogous to FIG. 2b and displays a portion of substrate 306 above which dielectric layers 300 and 301 have been formed. Dielectric layer 300 has been etched, selectively grown, or selectively deposited in order to create the recessed region or groove 302 therein. See the discussion above for a more detailed description of an embodiment by which the substrate of FIG. 3a may be formed and suggested materials of which it may be constructed.

Figure 3B:
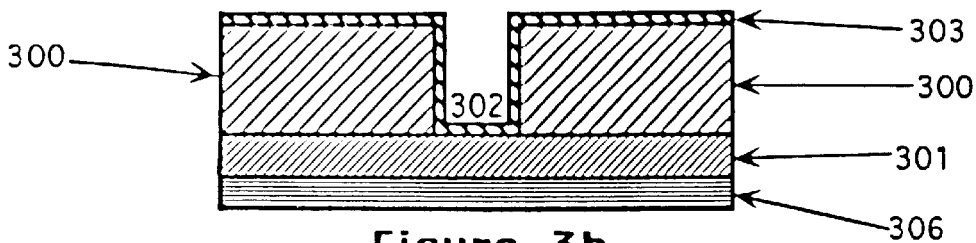

FIG. 3b shows the same region displayed in FIG. 3a after a barrier layer 303 has been formed. This barrier layer may serve one or more of several functions. For example, the barrier layer may be used to improve the adhesion between a subsequently formed layer and another layer. This helps prevent, for example, delamination or peeling from occurring during processing. Delamination may cause significant yield or reliability problems. The barrier layer may additionally serve to, for example, prevent materials contained within a subsequently formed layer from contaminating other regions of the semiconductor device, provide a more uniform layer onto which a subsequent layer may be formed in order to better model a process and reduce variability, improve the electrical contact between a subsequently formed conductive layer and another conductive layer, improve the wetting and agglomeration characteristics of a subsequently formed layer, prevent substrate damage by shielding against the radiation used for reflow, or passivate an underlying or subsequently formed layer.

Note that in accordance with this embodiment of the present invention, barrier layer 303 displayed in FIG. 3b has been deposited along the walls of groove 302 (conformal coverage). In an alternate embodiment of the present invention, barrier layer 303 may be deposited at the bottom of groove 302 and at the upper surfaces of dielectric layer 300 but not substantially along the walls of groove 302. Barrier layers constructed out of one or more of the following materials may exhibit one or more of the desired properties stated above: oxide, nitride, silicon oxynitride, silicon carbide, Mo, MoN, Ta, TaN, W, WN, V, VN, Nb, NbN, Ti, and TiN.

Figure 3C:
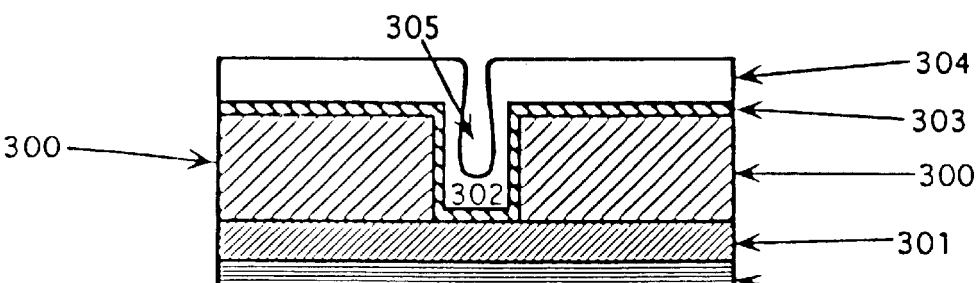
Figure 3D:
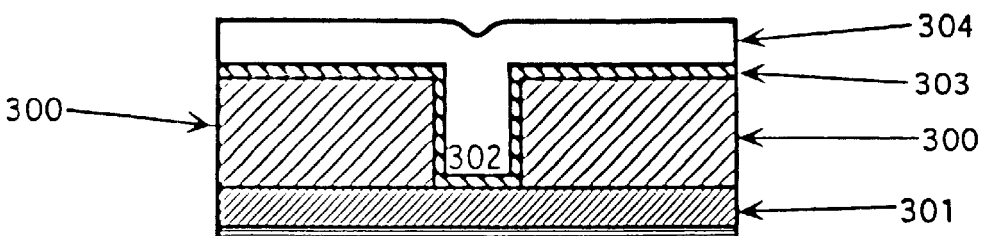
Figure 3E:
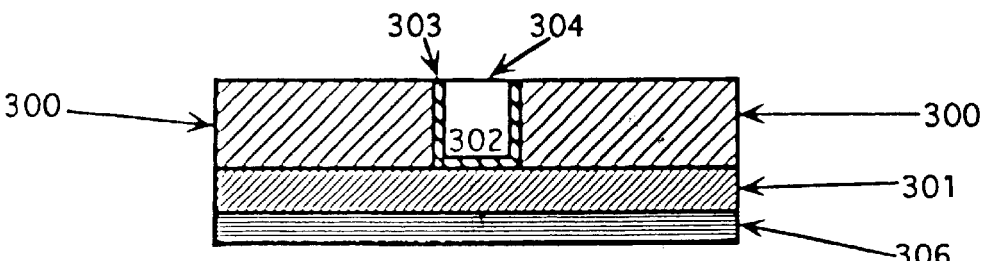

FIG. 3c shows the same region displayed in FIG. 3b after the remaining portion of conductive layer 304 has been blanket deposited creating gap 305. See the discussion above for a more detailed description of an embodiment by which conductive layer 304 may be formed and suggested materials of which it may be constructed. FIG. 3d illustrates the cross section of FIG. 3c after a reflow step has been performed. Note that gap 305 shown in FIG. 3c has been sealed by the reflow process in FIG. 3d with substantially no formation of a void or tunnel at the base of the gap. See the discussion above for a more detailed description of embodiments by which conductive layer 304 may be reflowed. FIG. 3e shows the cross section of FIG. 3d after the completion of an etch back process step in which conductive layer 304 and barrier layer 303 have been etched from the upper surface of dielectric layer 300. In an alternate embodiment of the present invention, at least a portion of barrier layer 303 is left on the upper surface of dielectric layer 300 after the completion of the etch back process. Again, see above for a more detailed discussion of the etch back process.

Where one desires to improve the step coverage of a conductive layer, one might employ the reflow process taught by the present invention in conjunction with a copper dry etch process. For example, copper, or an alloy thereof, is deposited on a semiconductor substrate. This copper layer is then subjected to a reflow process consistent with the reflow process taught by the present invention in order to improve the step coverage of the copper layer. The copper layer is then patterned using, for example, lithographic techniques, and then etched using, for example, an RIE, sputter, or ion mill etching process. In such a process, vias and interconnections may be formed from the same copper layer.

Thus a novel electrical interconnection manufacturing process has been described which improves the manufacturability, quality, reliability, and performance of semiconductor devices. This process is compatible with advanced VLSI and ULSI process techniques.

What is claimed is:

1. A method of forming an electrical conductor over a semiconductor substrate, said method comprising:
   forming a first layer over said semiconductor substrate, said first layer comprising copper as its primary element;
   reflowing said first layer by exposing said first layer to a temperature in the range of approximately 200° C. to 800° C.;
   patterning said first layer; and
   etching said first layer.

2. The method of claim 1, wherein at least a portion of said first layer is deposited by a method selected from the group consisting of sputtering, CVD, and evaporation.

3. The method of claim 2, wherein said first layer is formed and said reflowing is performed under high vacuum to extra high vacuum conditions within the same vacuum system.

4. The method of claim 1, wherein said first layer is formed and said reflowing is performed under high vacuum to extra high vacuum conditions within the same vacuum system.

5. The method of claim 1, further comprising forming a barrier layer for said first layer beneath at least a portion of said first layer.

6. The method of claim 5, wherein said barrier layer comprises a material selected from the group consisting essentially of oxide, nitride, silicon oxynitride, silicon carbide, Mo, MoN, Ta, TaN, W, WN, V, VN, Nb, NbN, Ti, TiN, and any combination thereof.

7. The method of claim 1, wherein said first layer comprises a material selected from the group consisting essentially of substantially pure copper, a vanadium alloy of copper, a niobium alloy of copper, a palladium alloy of copper, and any combination thereof.

8. The method of claim 1, wherein said first layer comprises substantially pure copper to which elements are added in an amount of between approximately 0.01 to 2 atomic percent to form an alloy thereof.

\* \* \* \* \*